United States Patent [19]

Matsumoto

[11] Patent Number: 4,959,616
[45] Date of Patent: Sep. 25, 1990

[54] DIGITAL OSCILLATION APPARATUS

[76] Inventor: Tokikazu Matsumoto, c/o Matsushita Electric Industrial Co., Ltd., 1006, Kadoma, Osaka, 571, Japan

[21] Appl. No.: 255,267

[22] Filed: Oct. 11, 1988

[30] Foreign Application Priority Data

Oct. 13, 1987 [JP] Japan .................................. 62-257556

[51] Int. Cl.$^5$ ...................... H03B 19/00; H03K 5/13; H03K 4/02; G06F 1/00
[52] U.S. Cl. ........................................ 328/14; 328/23; 328/38.1; 328/186; 307/227; 307/529; 307/271; 364/270; 364/933.1; 364/934
[58] Field of Search .................... 328/14, 23, 27, 34, 328/38.1, 61, 63, 72, 74, 142, 186; 307/227, 519, 529, 261, 271; 364/270, 933.1, 934

[56] References Cited

U.S. PATENT DOCUMENTS

| | | | |
|---|---|---|---|
| 2,858,434 | 10/1958 | Tollefson | 328/186 |
| 3,121,803 | 2/1964 | Watters | 307/227 |
| 3,657,657 | 4/1972 | Jefferson | 328/27 |
| 3,919,649 | 11/1975 | Logemann, Jr. | 307/227 |
| 4,692,713 | 9/1987 | Cordwell et al. | 328/27 |
| 4,727,570 | 2/1988 | Tarbouriech | 328/27 |
| 4,737,720 | 4/1988 | Mills | 328/27 |
| 4,804,863 | 2/1989 | Welland et al. | 328/186 |

FOREIGN PATENT DOCUMENTS

| | | | |
|---|---|---|---|
| 0165416 | 9/1983 | Japan | 307/227 |
| 0181315 | 10/1983 | Japan | 307/227 |
| 0150922 | 7/1987 | Japan | 307/227 |

Primary Examiner—Andrew J. James
Assistant Examiner—Trong Quang Phan

[57] ABSTRACT

A digital oscillation apparatus includes a data generator and an accumulator which function as follows. The data generator is responsive to each clock of a clock signal having a frequency fc for generating data used to generate a data string which has a total value R (R is an integer) in a repetition period of m clocks (m is an integer). Accordingly, the average value of each data of the data string generated in response to each clock becomes R/m. The accumulator has a dynamic range D (D is an integer) and is responsive to each clock of the clock signal for accumulating a sum of each data (average value=R/m) of the data string generated by the data generator and a constant A (A is an integer) until the accumulated result exceeds the dynamic range. That is, data having an average value A+R/m is accumulated in response to each clock of the clock signal. When the accumulated result exceeds the dynamic range D, the accumulator subtracts the dynamic range D from the accumulated result, or resets the accumulated result. If the values of R, m, A and D are set to satisfy a relationship of $fs/fc = (A + R/m)D$, where fs is a frequency of a periodic waveform data to be generated as an output of the apparatus, the accumulator generates periodic waveform data having a frequency $fs = (A + R/m) \cdot fc/D$.

8 Claims, 6 Drawing Sheets

DIGITAL OSCILLATION APPARATUS

BACKGROUND OF THE INVENTION

1. Field of the Invention

The present invention relates to a digital oscillation apparatus that generates waveform data representing a periodic waveform having a desired period.

2. Description of the Prior Art

Conventionally, in order to obtain periodic waveform data, an oscillation apparatus that accumulates a specific constant for every clock uses an adder that overflows when the data exceeds a dynamic range.

This apparatus can vary the period of the generated waveform by varying the value of the constant to be accumulated. However, since it cannot select any value for the constant in the integer operation, the period which can be obtained is limited.

SUMMARY OF THE INVENTION

An object of the present invention is to provide a digital oscillation apparatus which generates a periodic waveform data whose period is any rational-number multiple of the clock period.

This object can be achieved by a digital oscillation apparatus comprising a data generating means and an accumulating means which function as follows, The data generating means is responsive to each clock of a clock signal having a frequency fc for generating data used to generate a data string which has a total value R (R is an integer) in a repetition period of m clocks (m is an integer). Accordingly, the average value of each data of the data string generated in response to each clock becomes R/m. The accumulating means has a dynamic range D (D is an integer) and is responsive to each clock of the clock signal for accumulating a sum of each data (average value =R/m) of the data string generated by the data generating means and a constant A (A is an integer) until the accumulated result exceeds the dynamic range. That is, data having an average value A+ R/m is accumulated in response to each clock of the clock signal. When the accumulated result exceeds the dynamic range D, the accumulating means subtracts the dynamic range D from the accumulated result, or resets the accumulated result. If the values of R, m, A and D are set to satisfy a relationship of fs/fc= (A+R/m)/D, where fs is a frequency of a periodic waveform data to be generated as an output of the apparatus, the accumulating means generates periodic waveform data having a frequency fs=(A+R/m)·fc/D.

DESCRIPTION OF THE PREFERRED EMBODIMENTS

Figure 1:
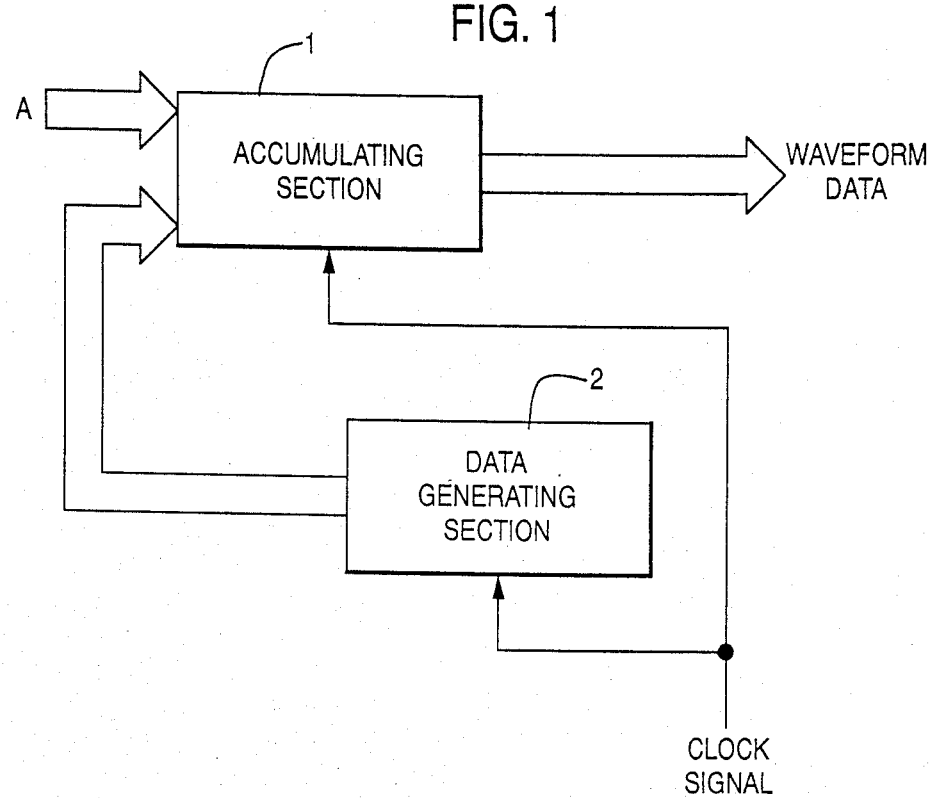
FIG. 1 is a block diagram showing a configuration of a first embodiment of the present invention.
Figure 2:
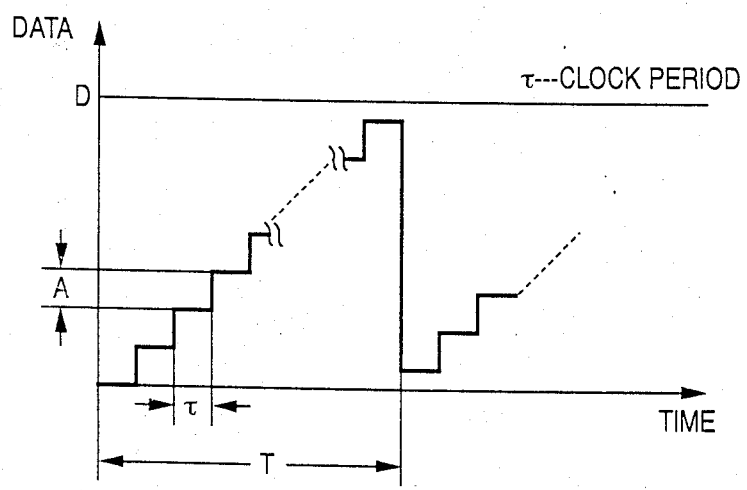
FIG. 2 is a waveform diagram showing an output data waveform of the first embodiment of the present invention.

In FIG. 1, a digital oscillation apparatus comprises an accumulating section 1 and a data generating section 2. The accumulating section 1 is responsive to each clock pulse of a clock signal to accumulate a constant A and an output of the data generating section 2. When the output of the data generating section 2 is constantly zero (0), output waveform data as shown in FIG. 2 is obtained. That is, if the clock period $\tau$, data increases by A at intervals of $\tau$, and when the data exceeds a dynamic range D, it overflows. As the result, a saw-tooth wave data is obtained. As is clear from FIG. 2, if the period of this saw-tooth waveform is T, the following relationship holds:

$$T = D \cdot \tau / A \qquad (1)$$

If the clock frequency is fc and the saw-tooth wave frequency is fs (i.e. fc=1/$\tau$ and fs=1/T), Eq. (1) can be rewritten as:

$$fs = (A/D) \cdot fc \qquad (2)$$

Thus, by changing the constant A and dynamic range D, the frequency of the saw-tooth waveform can be changed.

However, in general, the accumulating section 2 operates in binary notation, and in such an event, D becomes an exponentiation of two. Thus, if fs is to be optionally set in accordance with Eq. (2), optional A must be given. However, since A is also an integer, an optional fs cannot be obtained.

The data generating section 2 is provided to solve this problem, and functions as follows. The data generating section 2 periodically generates a data string at a period of m clocks (m is integer), and the total of the data string in each period is R (R is integer). Thus, the data average is R/m. Because the data having such an average value is always input to the accumulating section 1 together with the constant A, the accumulating section is, on the average, equivalent to accumulating A+R/m value every clock. Consequently, substituting A in Eq. (2) for A+R/m gives $$fs = \{(A+R/m)\}/D \cdot fc \qquad (3)$$

Thus, the proper selection of the integers R and m gives an optional frequency fs.

Eq. (3) can be also interpreted as follows. In Eq. (3), (A+R/m)/D denotes the ratio of to the saw-tooth wave frequency fs to the clock frequency fc, and if the ratio is expressed as k/h (where k and h are natural numbers and k/h is an irreducible fraction), we obtain $$k/h = (A+R/m)/D \qquad (4)$$

Consequently, if the dynamic range D of the accumulating section 1 and the ratio k/h are given, A, R, and m can be obtained as follows:

$$(k \cdot D)/h = A + R/m \qquad (5)$$

Thus, from Eq. (5), dividing k·D by h gives the quotient A with remainder R, and m is a denominator when (k·D)/h is reduced. For example, if D=512, k=3, and h=22, from Eq. (5) the left member is (3×512)/22=768/11=(69×11+9)/11

Thus, A=9, R=69×11=759, and m=11.

Figure 3:
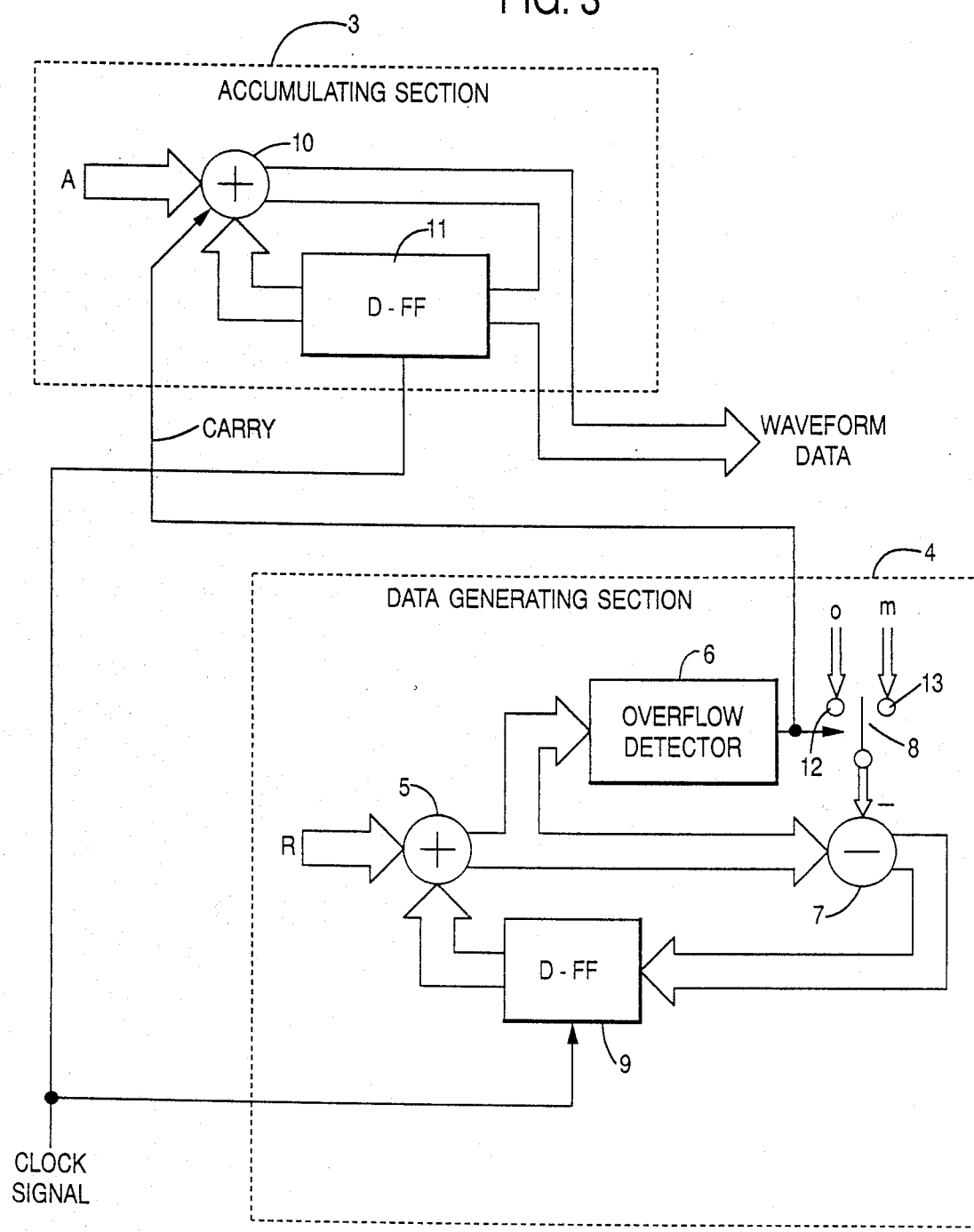
FIG. 3 is a block diagram showing a configuration of a second embodiment of the present invention.

Now, referring to FIG. 3, the second embodiment of the present invention is described hereunder. In FIG. 3 the accumulating section 3 comprises an adder 10 and a D-flip-flop 11 working as a delay circuit. Because the output of the adder 10 is delayed by one clock by the D-flip-flop 11 and returned to one input of the adder 10, the constant A inputted to another input of the adder 10 is accumulated every clock. The adder 10 overflows when the accumulated value exceeds D.

The adder 10 possesses a carry input, to which the output of the data generating section 4 is inputted.

The data generating section 4 of this embodiment comprises an adder 5, an overflow detector 6, a switching circuit 8, a subtraction circuit 7, and a D-flip-flop 9.

The adder 5 adds R to the output of the D flip-flop 9. The output of the adder 5 is checked by the overflow detector 6 to determine if it exceeds m, and should it exceed m, the switching circuit 8 switches to its terminal 13 to subtract m from the output of the adder 5 using the subtractor 7. The output of the subtractor 7 is fed to the D-flip-flop 9. The output of the D flip-flop 9 is returned to the adder 5. The overflow detector 6 outputs a "1" when detecting overflow and a "0" otherwise to the carry input of the adder 10 in the accumulating section 3.

Because the above configuration is equivalent to accumulating R in the residual algebraic system with m as modules, adding R by m times produces the same result. That is, the output data of the adder 5 has a cycle m, and the overflow detector 6 outputs a "1" at the rate of R times to m times. Consequently, the average of m times of outputs of the overflow detector 6 becomes R/m, and adding this signal to the carry input of the adder 10 in the accumulating section 3 can produce an equivalent effect to that of the first embodiment. The present embodiment is advantageous in that it can utilize the carry input of the adder 10 because the output of the data generating section 4 is either a "0" or a "1", that is, 1 bit.

Figure 4:
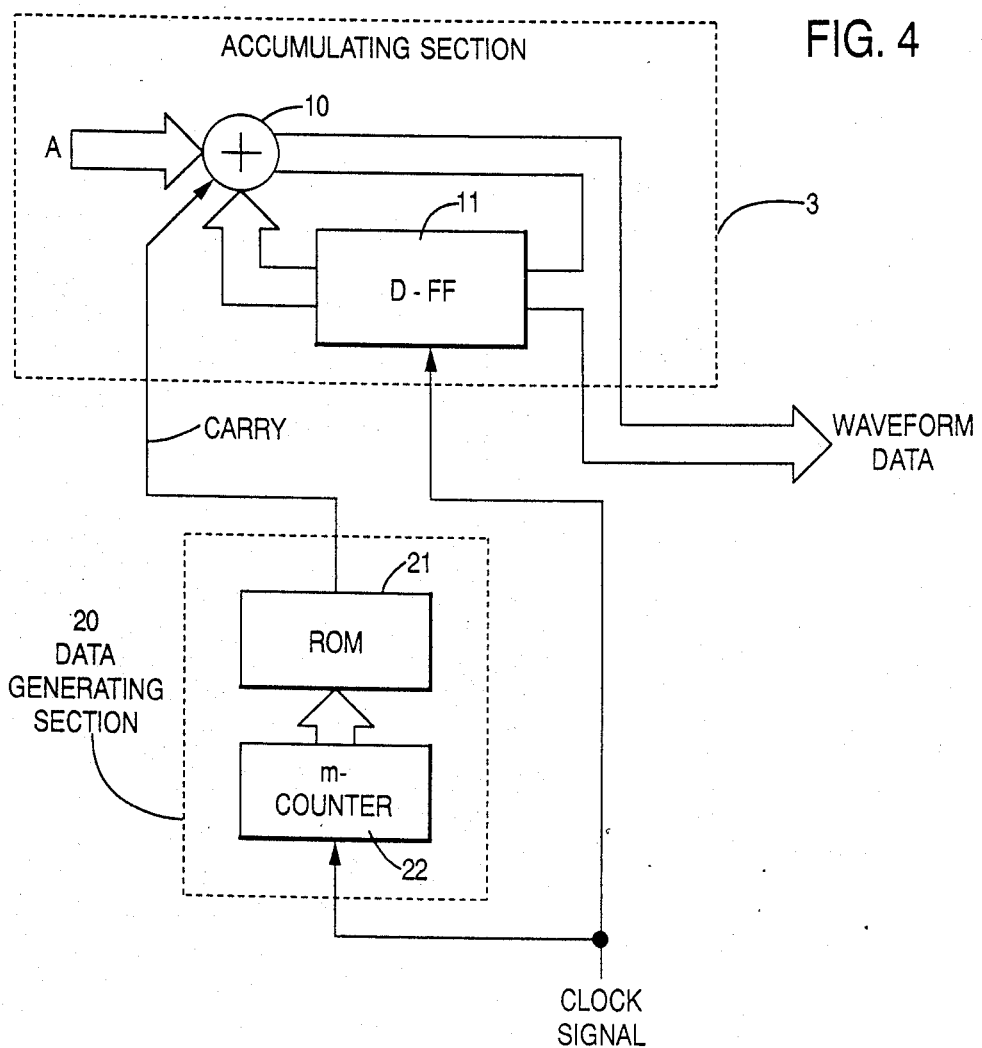
FIG. 4 is a block diagram showing a configuration of a third embodiment of the present invention.

Now referring to FIG. 4, the third embodiment is described. In this embodiment, the accumulating section 3 is the same as that of the second embodiment, while the data generating section 20 comprises an m-counter 22 and a ROM 21. The m-counter 22 divides the clock frequency by m. In the same fashion as the second embodiment, the data generating section 20 is a circuit which outputs "1" at the rate of R times to m times. In the present embodiment, the output of the m-counter 22 is input to the address input of ROM 21. ROM 21 stores a "1" in R addresses out of m addresses, and "0" in the remaining m-R addresses. This allows the third embodiment to perform the same operation as the first embodiment. Alternatively, if ROM 21 stores in advance a pattern to be obtained at the output of the data generating section 4 of the second embodiment, the third embodiment performs the same operation as the second embodiment.

Figure 5:
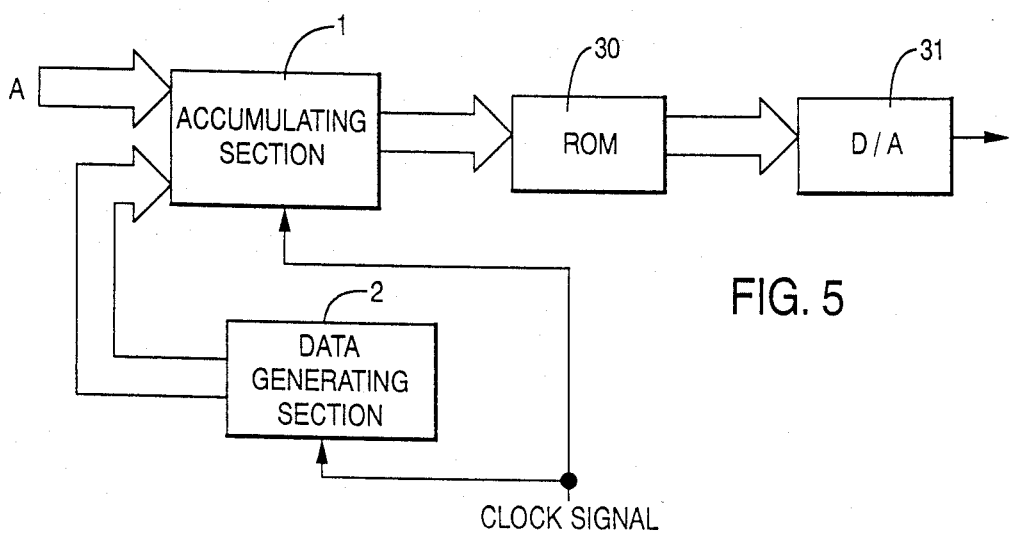
FIG. 5 is a block diagram showing a configuration of a fourth embodiment of the present invention.
Figure 6:
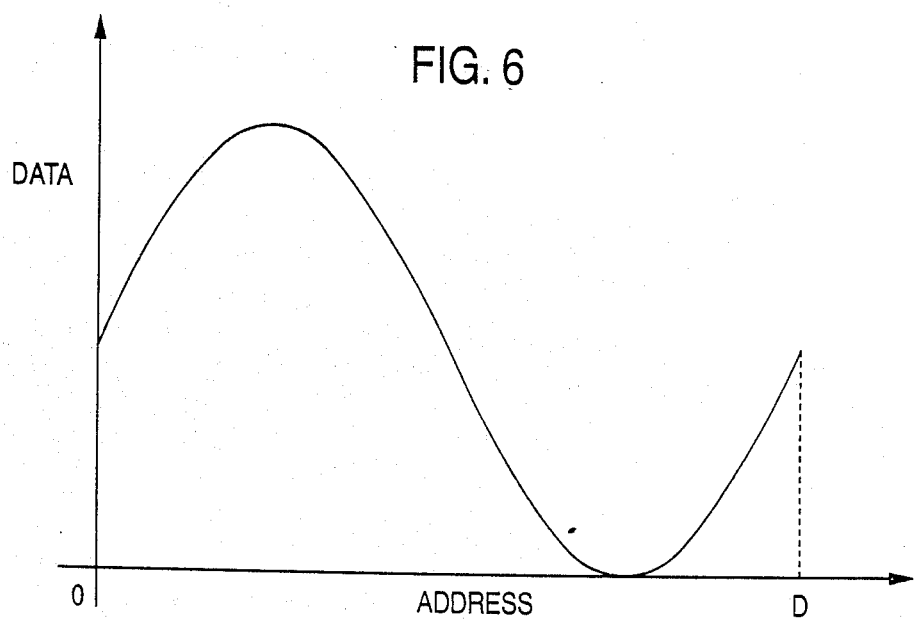
FIG. 6 is a waveform diagram showing waveform of data stored in a ROM in the fourth embodiment of the present invention.

Now, referring to FIG. 5, the fourth embodiment of the present invention is described. This embodiment is realized by adding a ROM 30 and a D/A converter 31 to the first embodiment. The output waveform of the accumulating section 1 is a saw-tooth waveform as shown in the first embodiment. Therefore, if sinusoidal data is stored in advance in ROM 30 as shown in FIG. 6 and the output data of the accumulating section 1 is fed to the address input of ROM 30, the output data of ROM 30 becomes sinusoidal waveform data. It is possible to convert this data with the D/A converter 31 to an analog sine wave. Storing an optional waveform data other than sine wave in ROM 30 allows an optional waveform to be produced.

Figure 7:
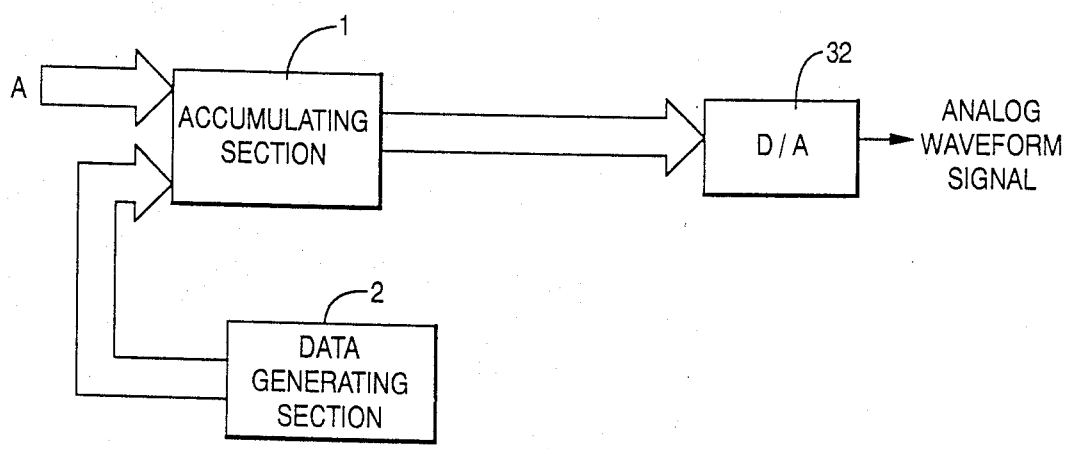
FIG. 7 is a block diagram showing a fifth embodiment of the present invention.

Now, referring to FIG. 7, the fifth embodiment of the present invention is described. This embodiment is realized by adding a D/A converter 32 to the first embodiment, thereby providing an analog saw-tooth waveform.

What is claimed is:

1. A digital oscillation apparatus for generating a periodic waveform data having a frequency fs comprising:

a data generating means responsive to each clock of a clock signal having a frequency fc for generating data used to periodically generate a data string having a constant total value of R with a period of m clocks so that the average value of each data of the data string generated in response to each clock of the clock signal is R/m, where each of R and m is an integer; and an accumulating means having a dynamic range D, where D is an integer, and being responsive to each clock of the clock signal for accumulating a sum of each data of the data string generated by said data generating means and a constant A, wherein A is an integer, to obtain accumulated data until the accumulated data exceeds the dynamic range D and for subtracting the dynamic range D from the accumulated data when the accumulated data exceeds the dynamic range D, thereby generating a periodic waveform data having a frequency fs, wherein the values of R, m, A and D satisfy a condition of fs/fc=(A+R/m)/D so that the frequency fs of the periodic waveform data becomes fs=(A+R/m)·fc/D.

2. A digital oscillation apparatus according to claim 1, wherein said data generating means generates, as the data string, a data "1" in response to R clocks out of m clocks and a data "0" in response to the remaining m-R clocks, and wherein said accumulating means comprises: a delay means for delaying data inputted thereto by one clock period; and an adding means for adding the constant A, output data of said delay means and, as a carry, the data generated by said data generating means, the added data being fed to said delay means and at the same being outputted as the accumulated data.

3. A digital oscillation apparatus according to claim 2, wherein said data generating means comprises: a delay means for delaying data inputted thereto by one clock period; and an adding means for adding the constant D and output data of said delay means, the added data being fed to said delay means, and for generating a carry data "1" when the added data exceeds m, the carry data being outputted as the data generated by said data generating means.

4. A digital oscillation apparatus according to claim 2, wherein said data generating means comprises: a counting means for dividing the clock signal frequency by m; and a memory means having a data "1" stored therein in R addresses out of m addresses and having a data "0" stored in the remaining m-R addresses for outputting the stored data, as the data generated by said data generating means, according to an output of said counting means received as address data.

5. A digital oscillation apparatus according to claim 1, further comprising a memory means having data corresponding to a predetermined waveform stored therein for receiving the waveform data from said accumulating means as address data for outputting the stored data to obtain a predetermined periodic waveform data.

6. A digital oscillation apparatus according to claim 5, wherein said memory means has sinusoidal waveform data stored therein.

7. A digital oscillation apparatus according to claim 5, further comprising a digital-to-analog conversion means for converting the waveform data from said memory means to an analog waveform signal.

8. A digital oscillation apparatus according to claim 1, further comprising a digital-to-analog conversion means for converting the waveform data from said accumulating means to an analog waveform signal.

* * * * *